(12) United States Patent
Bathan

(10) Patent No.: US 11,810,842 B2
(45) Date of Patent: Nov. 7, 2023

(54) SIDE-SOLDERABLE LEADLESS PACKAGE

(71) Applicant: Semtech Corporation, Camarillo, CA (US)

(72) Inventor: Henry Descalzo Bathan, Thousand Oaks, CA (US)

(73) Assignee: Semtech Corporation, Camarillo, CA (US)

( * ) Notice: Subject to any disclaimer, the term of this patent is extended or adjusted under 35 U.S.C. 154(b) by 170 days.

(21) Appl. No.: 17/137,791

(22) Filed: Dec. 30, 2020

(65) Prior Publication Data

US 2021/0118776 A1 Apr. 22, 2021

Related U.S. Application Data

(62) Division of application No. 16/044,045, filed on Jul. 24, 2018, now Pat. No. 10,892,211.

(60) Provisional application No. 62/543,211, filed on Aug. 9, 2017.

(51) Int. Cl.
| | |
|---|---|
| *H01L 23/495* | (2006.01) |
| *H01L 21/48* | (2006.01) |
| *H01L 21/56* | (2006.01) |
| *H01L 21/78* | (2006.01) |

(52) U.S. Cl.
CPC .... *H01L 23/49565* (2013.01); *H01L 21/4825* (2013.01); *H01L 21/4828* (2013.01); *H01L 21/565* (2013.01); *H01L 21/78* (2013.01); *H01L 23/49503* (2013.01); *H01L 23/49513* (2013.01); *H01L 23/49548* (2013.01); *H01L 23/49562* (2013.01); *H01L 2224/16245* (2013.01); *H01L 2224/97* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 6,489,218 | B1 | 12/2002 | Kim et al. |
| 7,183,630 | B1 | 2/2007 | Fogelson et al. |
| 8,809,119 | B1 | 8/2014 | Espiritu et al. |
| 8,890,301 | B2 | 11/2014 | Kierse |
| 9,818,656 | B1 | 11/2017 | Schlarmann et al. |
| 2005/0017335 | A1 | 1/2005 | Tabira |
| 2005/0023658 | A1 | 2/2005 | Tabira et al. |
| 2006/0043566 | A1 | 3/2006 | Nakashishi |
| 2010/0133693 | A1* | 6/2010 | Arshad ............... H05K 3/3442 257/762 |
| 2011/0031526 | A1* | 2/2011 | Han ..................... H01L 33/647 257/E33.066 |

(Continued)

FOREIGN PATENT DOCUMENTS

| | | |
|---|---|---|
| GB | 2392778 A | 3/2004 |
| JP | 2005051130 A | 2/2005 |

(Continued)

*Primary Examiner* — Benjamin P Sandvik
(74) *Attorney, Agent, or Firm* — Brian M. Kaufman; Robert D. Atkins; PATENT LAW GROUP:Atkins and Associates, P.C.

(57) ABSTRACT

A leadframe is formed by chemically half-etching a sheet of conductive material. The half-etching exposes a first side surface of a first contact of the leadframe. A solder wettable layer is plated over the first side surface of the first contact. An encapsulant is deposited over the leadframe after plating the solder wettable layer.

17 Claims, 14 Drawing Sheets

(56) References Cited

U.S. PATENT DOCUMENTS

| | | | |
|---|---|---|---|
| 2011/0210354 A1* | 9/2011 | Ichikawa | H01L 24/97 |
| | | | 438/27 |
| 2012/0086041 A1 | 4/2012 | Isogai | |
| 2012/0132933 A1 | 5/2012 | Watari et al. | |
| 2013/0187188 A1 | 7/2013 | Sasaoka et al. | |
| 2013/0256733 A1* | 10/2013 | Lin | H01L 23/49562 |
| | | | 257/E33.066 |
| 2013/0270588 A1* | 10/2013 | Wang | F21S 4/20 |
| | | | 257/676 |
| 2014/0035113 A1 | 2/2014 | Kierse | |
| 2014/0308767 A1 | 10/2014 | Lin et al. | |
| 2014/0357022 A1 | 12/2014 | Stacey | |
| 2015/0076549 A1 | 3/2015 | Gebuhr et al. | |
| 2015/0076675 A1 | 3/2015 | Real et al. | |
| 2015/0084172 A1 | 3/2015 | Do et al. | |
| 2015/0091144 A1* | 4/2015 | Taguchi | H01L 23/49517 |
| | | | 438/123 |
| 2016/0064633 A1 | 3/2016 | Park et al. | |
| 2016/0254214 A1 | 9/2016 | Makino | |

FOREIGN PATENT DOCUMENTS

| | | |
|---|---|---|
| JP | 2005079372 A | 3/2005 |
| JP | 2014060372 A | 4/2014 |
| JP | 2014168102 A | 9/2014 |
| TW | M531057 U | 10/2016 |

\* cited by examiner

SIDE-SOLDERABLE LEADLESS PACKAGE

CLAIM TO DOMESTIC PRIORITY

The present application is a division of U.S. patent application Ser. No. 16/044,045, now U.S. Pat. No. 10,892,211, filed Jul. 24, 2018, which claims the benefit of U.S. Provisional Application No. 62/543,211, filed Aug. 9, 2017, which applications are incorporated herein by reference.

FIELD OF THE INVENTION

The present invention relates in general to semiconductor devices and, more particularly, to a semiconductor device and method of forming a side-solderable leadless package (SLP).

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

Quad flat no-lead (QFN) or dual flat no-lead (DFN) packages are becoming common as the race to smaller devices benefits from packages without leads that extend from the package. Leadless packages generally have exposed contacts that are coplanar with, or recessed within, surfaces of the package encapsulant rather than leads extending from the side or bottom of the encapsulant.

Leadless packages are mounted to a substrate by reflowing solder between the leadframe contacts and contact pads on the substrate. Manufacturers desire that contacts of leadless packages have side solderable surfaces. Side solderable surfaces of leadless packages cause reflowed solder to form a fillet between the side solderable surfaces and substrate. Solder fillets are useful to manufacturers of electronic devices because proper interconnection between the package and substrate can be verified visually by a human or by an automatic visual inspection device. If a visual inspection shows that a proper fillet was not formed for one of the package contacts, an error is recorded. The device with the faulty connection can be repaired or discarded.

However, forming solder fillets for visual inspection relies on side surfaces of package contacts being solder wettable. To promote reflow of solder onto side surfaces of contacts, a manufacture of a leadless package will commonly plate the contacts with a wettable material as part of the packaging process. Metal plating is commonly done with various electroplating or electroless deposition methods. Electroplating is the more desirable plating method because a thicker and faster metal deposition occurs. The thicker metal layer provided by electroplating provides a more reliable solder fillet, especially after parts sit on a shelf for a significant period of time before being soldered.

One method of electroplating involves using a saw to cut through only a portion of the leads of a panel of devices after encapsulating the packages. Cutting to a depth about halfway through the package's contacts leaves the contacts having a stair-step appearance, which can be referred to as step cutting. The leads of adjacent devices remain electrically connected to each other through the uncut portions to pass electrical current for electroplating. Step cutting with a saw blade and then plating creates extra manufacturing work and cost, which would be advantageous to eliminate.

Therefore, a need exists for leadframe designs that allow electroplating side surfaces of the contacts without requiring a step cutting and plating as part of the packaging process.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
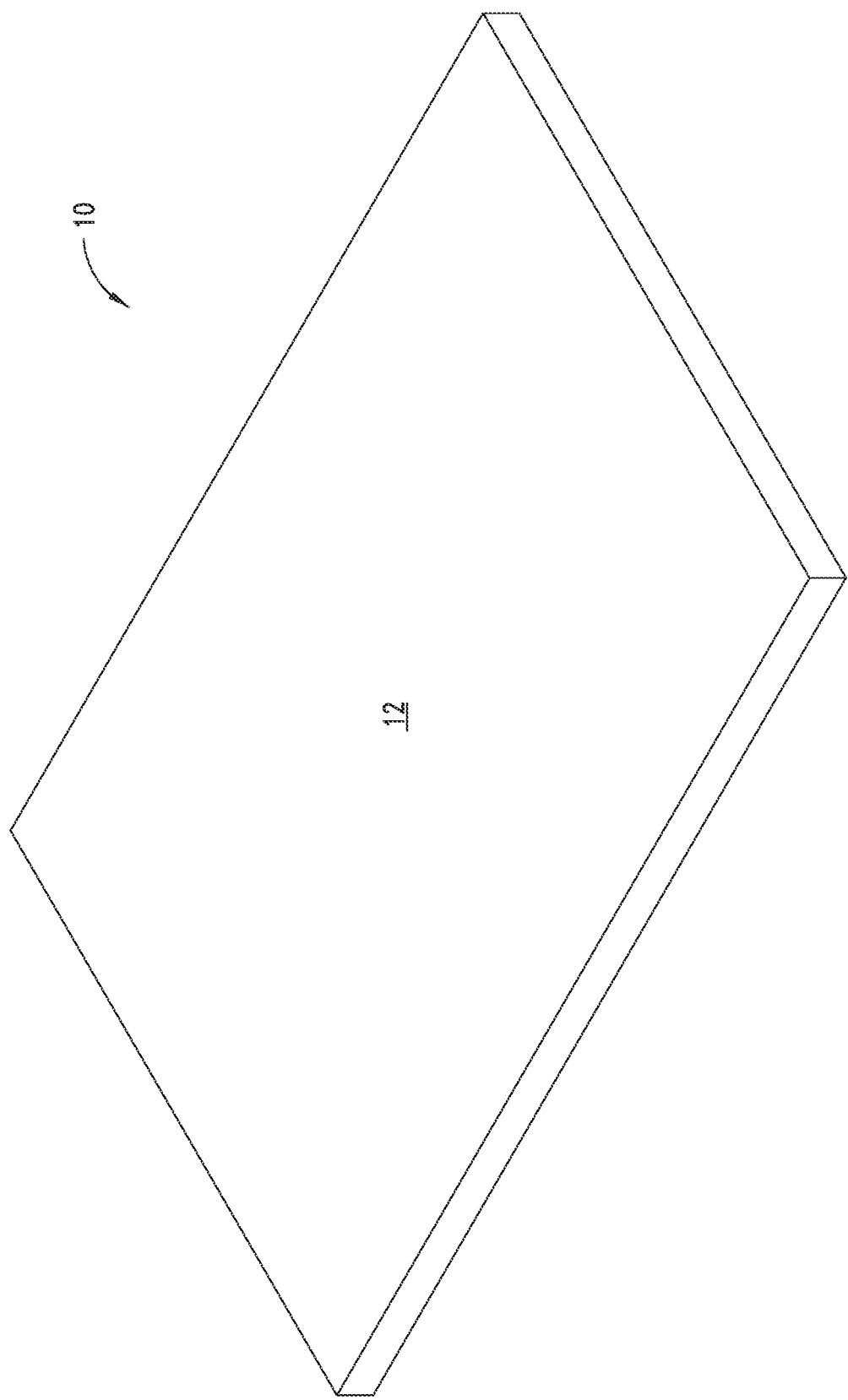
FIGS. 1a-1h illustrate a process of forming an SLP.

FIG. 1a illustrates a sheet 10 of conductive base material used to form a leadframe. The base material is commonly copper, but aluminum, gold, iron, nickel, combinations and alloys thereof, or other appropriate leadframe materials are used in other embodiments. Sheet 10 is formed from raw material by rolling, pressing, molding, or any other suitable means for forming a sheet with substantially planar top and bottom surfaces that are substantially parallel with each other. In one embodiment, a pre-plated frame (PPF) is used for sheet 10. A PPF can be a sheet of copper with top and bottom surfaces plated with one or more layers of other metals, such as tin, nickel, gold, or palladium. Sheet 10 includes a uniform thickness with a length and width configured as desired for the number of semiconductor devices being formed in a single panel.

A leadframe is formed from sheet 10 by performing a chemical etching on the top and bottom surfaces of the sheet. The chemical etching is performed using a photolithography process. Each chemical etching goes approximately halfway through sheet 10, referred to as half-etching. Photo-mask layers are used to control which areas are etched from each side. Areas of sheet 10 that are half-etched from both the bottom and the top surfaces are etched completely through the sheet and become openings through the sheet. Areas that are only half-etched from one side or the other remain approximately half the thickness of the original sheet 10, and areas that are masked off for both etching steps remain at full thickness. In other embodiments, other half-etching mechanisms are used.

In FIG. 1a, bottom surface 12 is oriented upwards toward the viewer, as that is the side of the leadframe that is half-etched first in this embodiment. In other embodiments, the top of the leadframe is half-etched first. The designation of one side of sheet 10 as top or bottom is arbitrary in many embodiments. Prior to etching, there is commonly no difference between the top and bottom. Flipping over sheet 10 in FIG. 1a would result in a view that is essentially identical to the illustrated view.

Figure 1B:
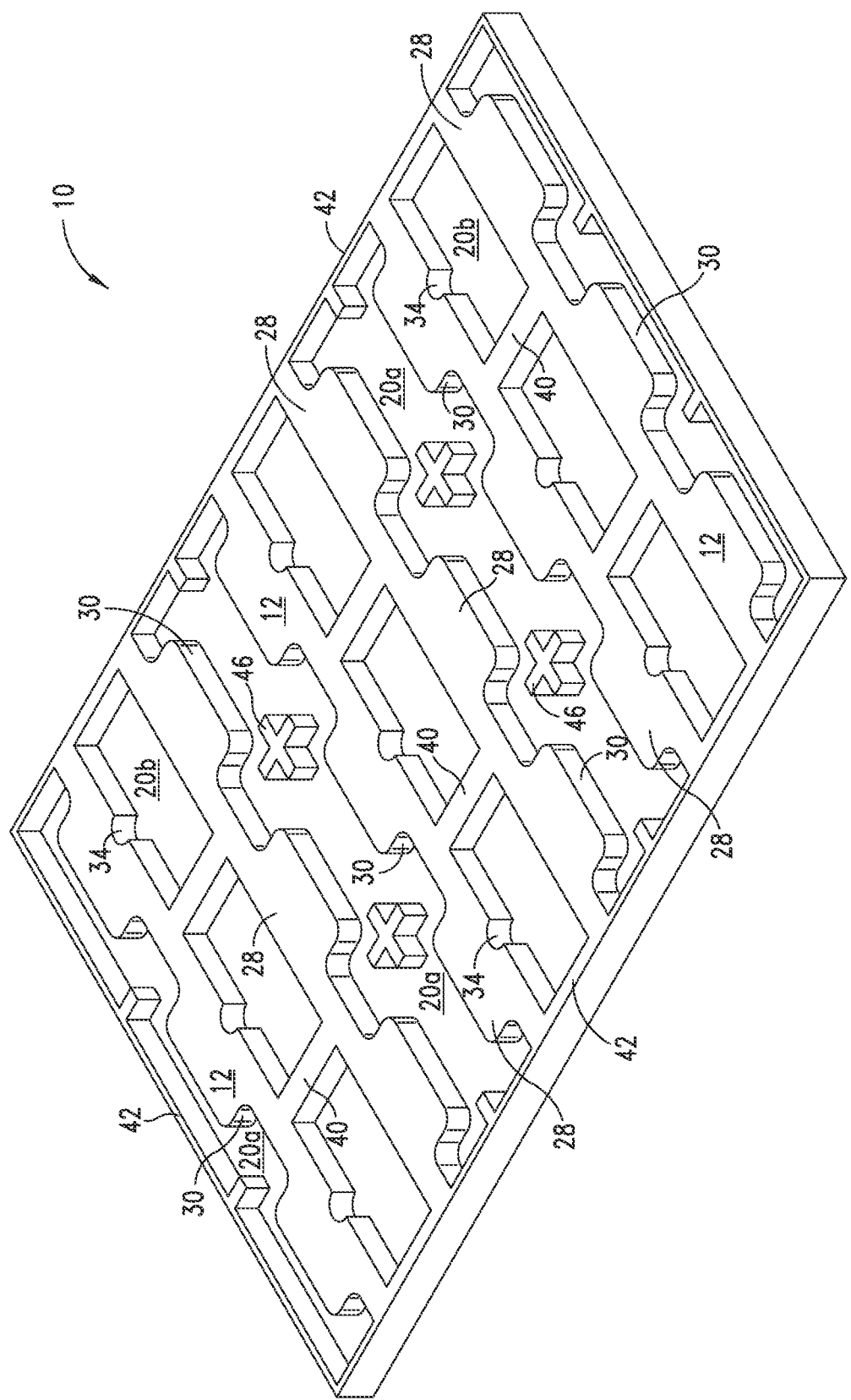

FIG. 1b illustrates sheet 10 after bottom surface 12 is half-etched, but before the top surface is etched. The half-etched areas of sheet 10 form a surface 20 that is oriented in substantially the same direction as bottom surface 12 but is at a reduced height. The half-etching does not extend completely through sheet 10. Flipping sheet 10 at the stage illustrated in FIG. 1b still results in a view that is essentially identical to the view in FIG. 1a because the half-etching does not extend to the top surface.

The half-etching in FIG. 1b is configured to form a three-by-three array of devices from the leadframe. Areas 20a are half-etched between devices, while areas 20b are half-etched in the middle of each device. In other embodiments, hundreds or thousands of devices are formed from a single leadframe. Each device section includes a pair of contacts 28 with an area 20b between the two contacts of a device. The main body of each contact 28 is not etched from bottom surface 12 and remains at the full thickness of sheet 10. Each contact 28 includes a side surface 30 that will be exposed and solderable in the final device. Side surfaces 30 are exposed by the etching of areas 20a. One contact 28 of each of the devices includes a notch 34 oriented toward the inside of the device to identify which of the contacts is pin one.

Each device includes a centrally located space, over surface 20b and between contacts 28, which will be filled with encapsulant during device formation. Dambars 40 are optionally formed around surfaces 20b to keep the encapsulant contained within the central area of each device. Dambars 40 increase structural integrity of the leadframe by physically coupling rows of devices to adjacent rows, and also reduce the likelihood of encapsulant flowing out and covering side surfaces 30. Encapsulant is preferably contained only within the area over surfaces 20b in FIG. 1b, and does not flow within the area of surfaces 20a. Thus, side surfaces 30 of contacts 28 remain exposed from the encapsulant for a subsequent solder connection. In some embodiments, a ridge 42 is formed around the leadframe to block encapsulant from encroaching through the side of the leadframe and covering side surfaces 30. Ridge 42 is not required in embodiments where other measures are taken to seal the perimeter of the leadframe from encapsulant.

Support structures 46 are formed in the space between devices for physical support during encapsulation. The space adjacent to side surfaces 30 under surfaces 20a is substantially sealed during the encapsulation process, which may result in significant pressure applied to those regions of the leadframe. Support structures 46 act as pillars to support the leadframe, specifically surface 20a, against the pressure of the molding process.

Support structures 46 help maintain structural integrity of the leadframe during encapsulation. In addition, support structures 46 are shaped as crosses, or another shape, to act as fiducial markers. Support structures 46 are formed in saw streets between units, so the particular shape of the support structures is not generally relevant to the final device. The cross-shaped support structures 46 can extend to each other in parallel with the rows of device, and to side surfaces 30 in the perpendicular direction. In other embodiments, support structures 46 are circular or any other appropriate shape for a pillar. A code can be implemented by varying the shapes of support structures 46. The code can then be used to locate a particular row and column within the frame.

Side surfaces 30 are the side solderable surfaces that a final device will depend on to produce a good solder fillet. The side surfaces are exposed as of the step illustrated in FIG. 1b. Therefore, the structure shown in FIG. 1b could be electro-plated with a solder wettable layer, and the plated layer would remain in the final device and provide a solder wettable contact flank. In other embodiments, plating occurs at a later stage.

Contacts 28, dambars 40, ridge 42, and support structure 46 are formed by creating a masking layer over those regions of bottom surface 12. The masking layer is removed over surfaces 20a and 20b, and remains in the shape of the full thickness regions. The etching removes substrate material to reduce a thickness of the substrate within the regions of surfaces 20a and 20b, while the mask protects contacts 28, etc., from the chemical etchant. The mask is removed after etching.

Figure 1C:
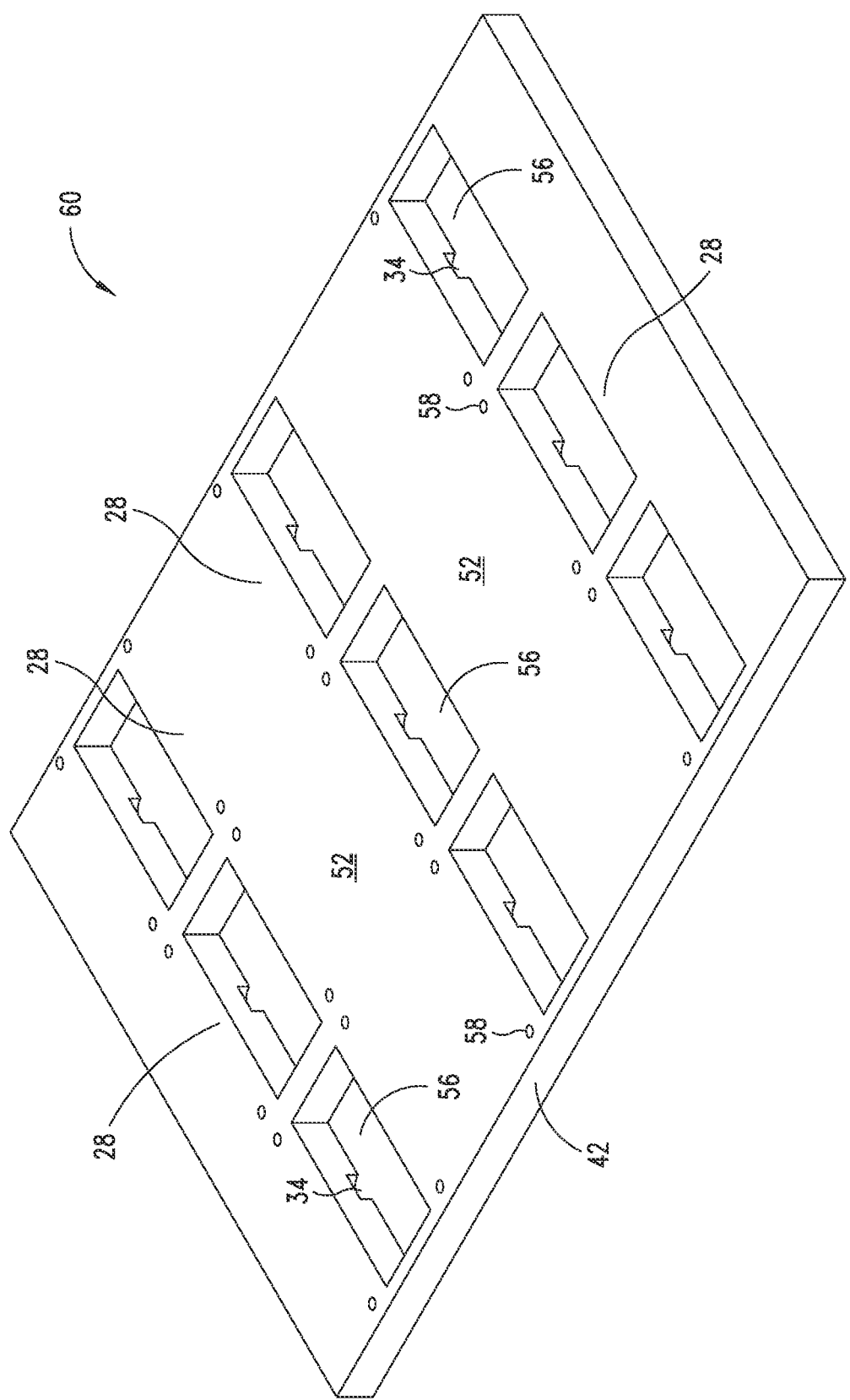

In FIG. 1c, sheet 10 is flipped so that top surface 52 is oriented up. Top surface 52 is generally identical to bottom surface 20 of sheet 10 before etching, but on the opposite side of the sheet. In FIG. 1c, top surface 52 is half-etched in much the same manner as bottom surface 20 was to form openings 56 and indentations 58, but in a different pattern. Openings 56 are formed by half-etching surfaces 20b from the opposite side of sheet 10, which results in those locations being etched completely through the sheet. Surfaces 20a are not etched from back surface 52, thus surfaces 20a remain intact. The portion of sheet 10 that forms surfaces 20a protects side surfaces 30 from being covered in encapsulant during packaging. Notches 34 can be etched from both sides, but are illustrated as only being etched from bottom surface 12. Having notches 34 that do not extend to top surface 52 increases surface area for mounting a semiconductor die to the top surface of the leadframe, and increases the locking of mold to the contact 28 as notch 34 fills with encapsulant.

Indentations 58 are half-etched through top surface 52 within contacts 28. Indentations 58 extend only partially through sheet 10. Encapsulant fills indentation 58 to increase mold lock, i.e., the grip of the encapsulant on contacts 28. Increased mold lock reduces the likelihood that contacts 28 will separate from the encapsulant. Any number and shape of indentations 58 can be formed as appropriate in any appropriate location. Indentations 58 can be a plurality of circles as shown in FIG. 1c. In other embodiments, indentations 58 are formed as dimples spread over the entire top surface of contacts 28. In another embodiment, indentations 58 are each elongated across a plurality of contacts 28, or form any other desired shape.

Once sheet 10 is half-etched on both top surface 52 and bottom surface 12, the sheet has been manufactured into a completed leadframe 60. Leadframe 60 can be plated at this stage of the manufacturing process because side surfaces 30, which are to be plated with a wettable material, are exposed. Dambars 40 will prevent side surfaces 30 from subsequently being covered in encapsulant during the packaging process. The plating applied to leadframe 60 can include tin, palladium, nickel, gold, solder, another conductive material, or combinations thereof. In one embodiment, three separate layers of palladium, nickel, and gold, respectively, are plated over leadframe 60. Side surfaces 30 are covered in the plating material, which produces contacts 28 with side solderable surfaces.

A semiconductor packaging firm will commonly order leadframes from a leadframe manufacturer to be delivered in the state shown in FIG. 1c, with half-etching and plating already performed. Then, the semiconductor packaging firm packages semiconductor die on the leadframe as shown in FIGS. 1d-1h. Having side surface plating performed by the leadframe manufacturer reduces the amount of work that a semiconductor packaging firm has to perform. The semiconductor packaging firm does not have to perform sawing and plating steps as part of the packaging process in order to plate side surfaces of the leads. In some cases, the same entity manufactures the leadframe, plates the leadframe, and then forms a semiconductor package using the leadframe. In other cases, the semiconductor packaging firm performs the plating rather than the leadframe manufacturer, but the process is still made easier by not having to perform a step cutting before plating in order to get contacts having wettable flanks. The above and below illustrated steps can be performed by any combination of entities as commercially suitable.

Figure 1D:
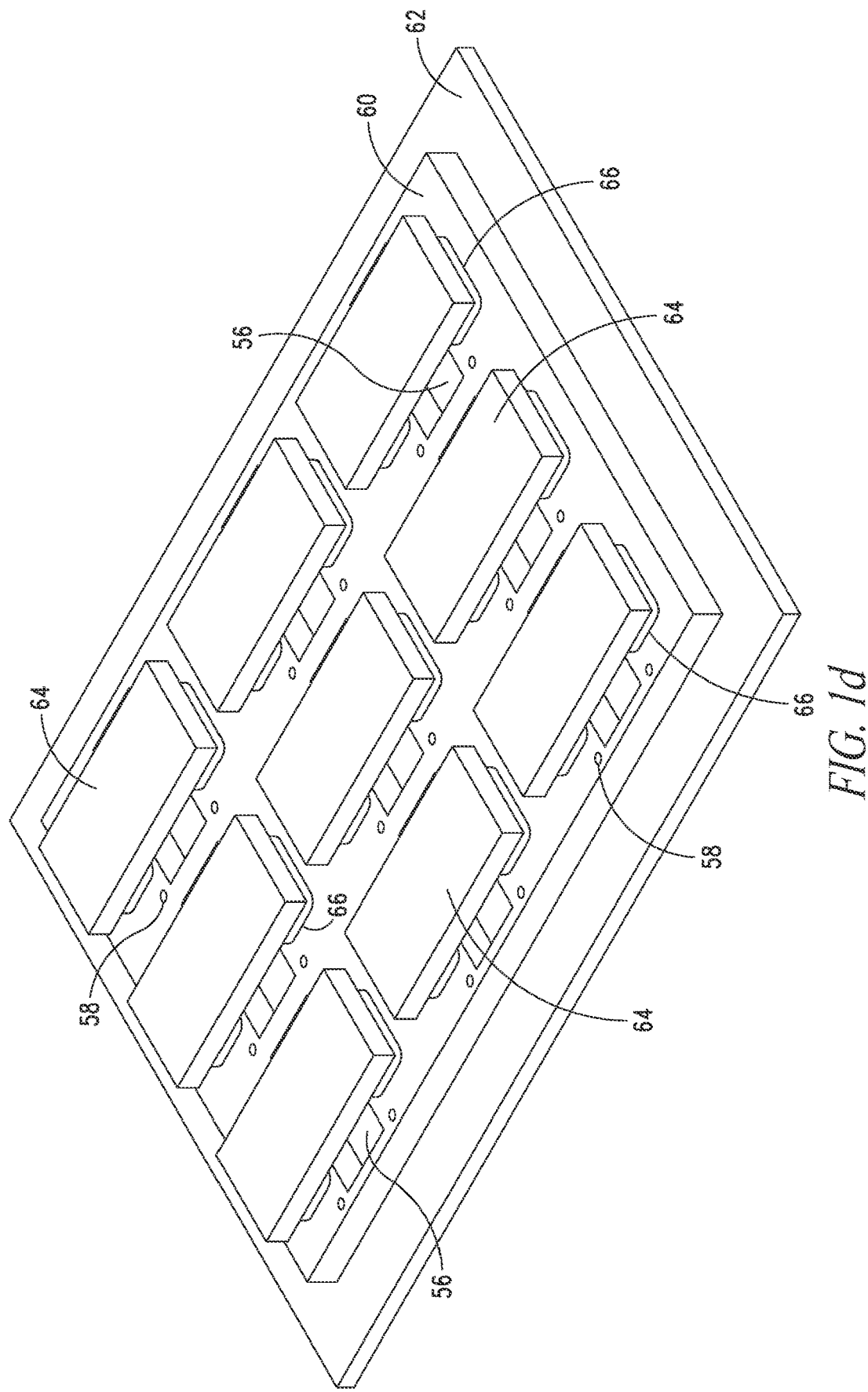

In FIG. 1d, leadframe 60 is placed on a carrier 62 and a semiconductor die 64 is disposed onto each pair of contacts 28. In some embodiments, the top surface of carrier 62 includes a double-sided tape, thermal release layer, ultraviolet release layer, an adhesive layer, or another suitable interface layer to hold leadframe 60 on carrier 62 while also allowing later release. Semiconductor die 64 include contact pads 66 formed over the semiconductor die, which are electrically connected and mechanically bonded to contacts 28 of leadframe 60 by solder or another appropriate means. Semiconductor die 64 are two-terminal devices, e.g., a transient voltage suppression diode.

Figure 1E:
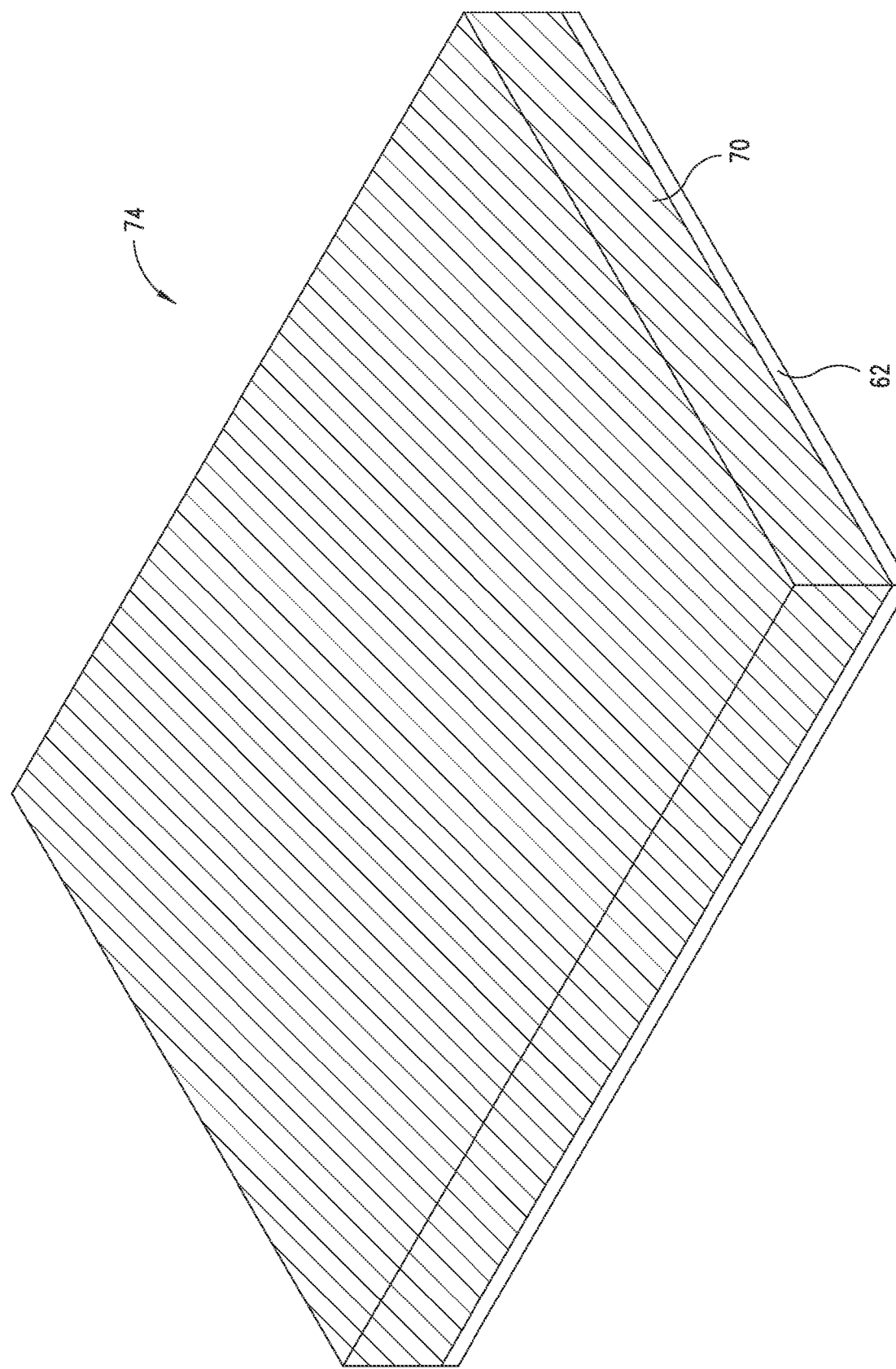

In FIG. 1e, an encapsulant or molding compound 70 is deposited over substrate 60 and semiconductor die 64 using a paste printing, compressive molding, transfer molding, liquid encapsulant molding, vacuum lamination, spin coating, or other suitable applicator. Encapsulant 70 can be polymer composite material, such as epoxy resin, epoxy acrylate, or any suitable polymer, with or without a filler. Any suitable molding compound is used for encapsulant 70 in other embodiments. Encapsulant 70 is non-conductive and environmentally protects the semiconductor devices from external elements and contaminants. Encapsulant 70 also protects semiconductor die 64 from degradation due to exposure to light. Leadframe 60 and semiconductor die 64 with encapsulant 70 form a panel 74 of unsingulated devices.

Encapsulant 70 extends to the edges of carrier 62 to completely cover the top and sides of leadframe 60, including flowing through openings 56. However, the encapsulant does not flow over side surfaces 30 of contacts 28. Dambars 40 and ridge 42 block the encapsulant from entering the void in leadframe 60 over surfaces 20a, where side surfaces 30 and support structures 46 are located.

Figure 1F:
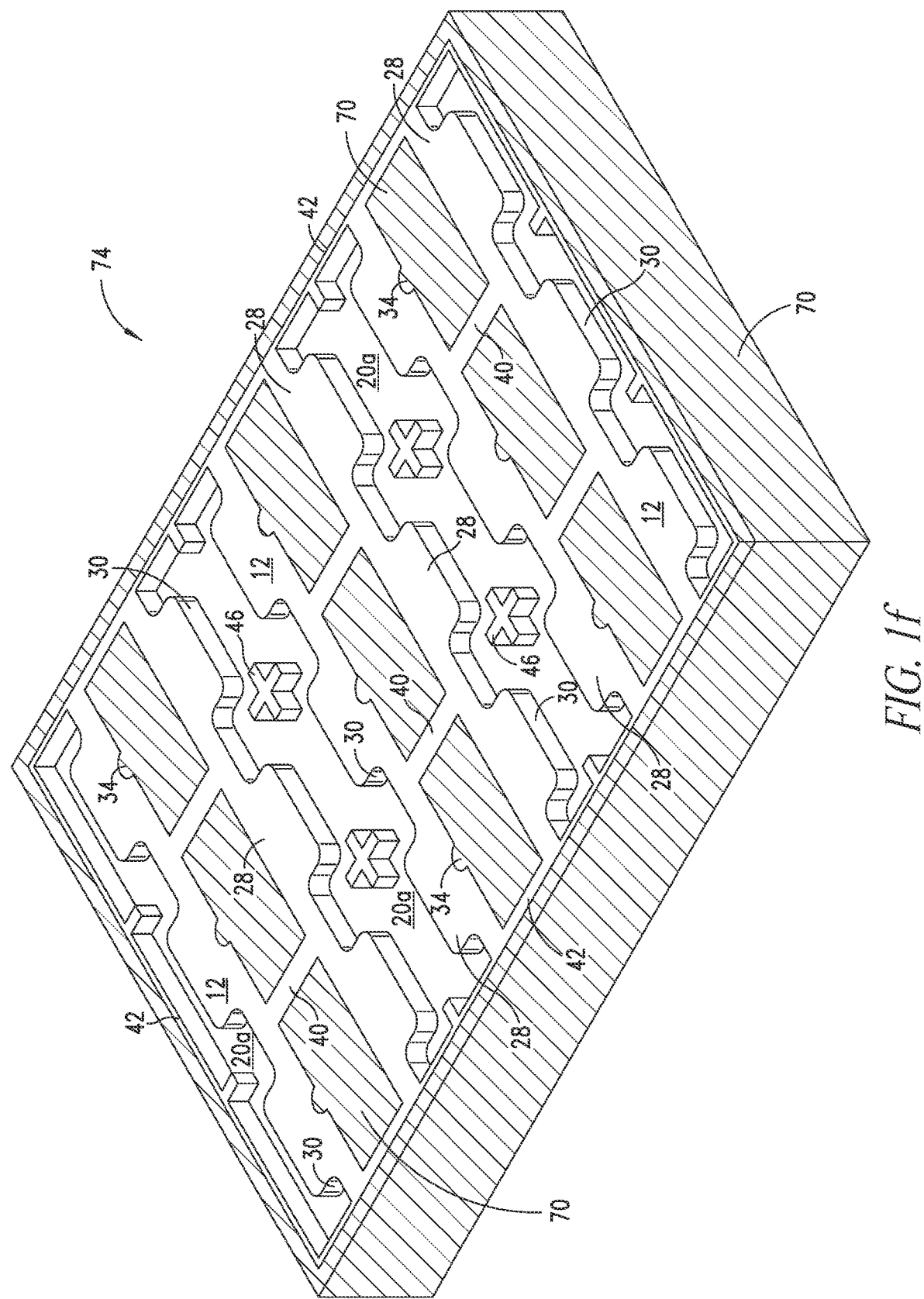

FIG. 1f illustrates panel 74 flipped over with carrier 62 removed so that leadframe 60 is visible. Encapsulant 70 has filled in openings 56 under each semiconductor die 64. Side surfaces 30 of contacts 28, including the plating applied at the leadframe manufacturer, remain exposed from the encapsulant. Dambars 40 kept encapsulant 70 contained within openings 56 during the molding process. Leadframe 60 could still be plated after encapsulation if needed, e.g., if the leadframe manufacturer did not perform the plating, without having to saw through contacts 28. Side surfaces 30 remain exposed and are each electrically connected through leadframe 60 to allow electroplating to occur.

Figure 1G:
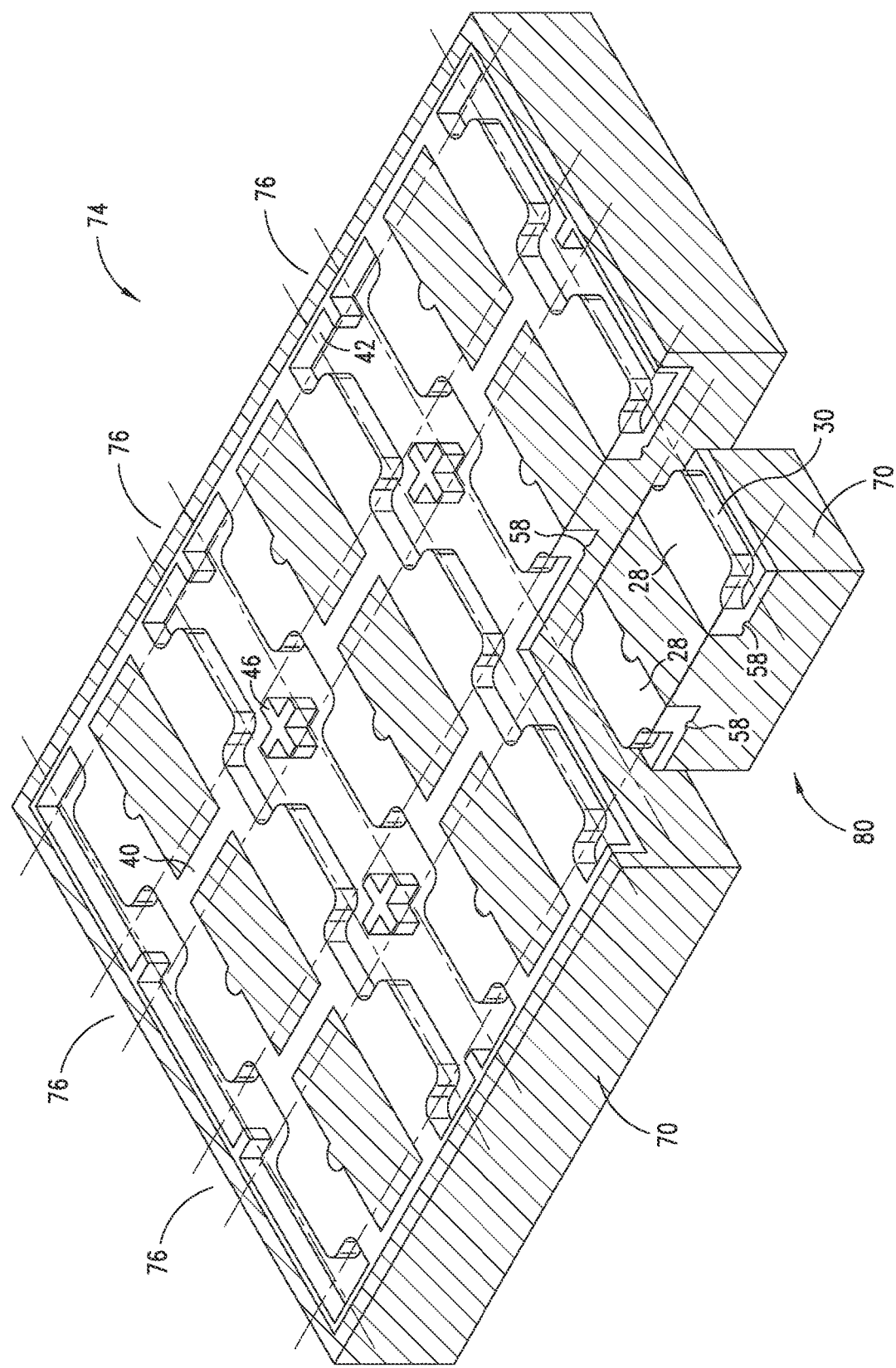

In FIG. 1g, panel 74 is singulated through saw streets 76 using a saw blade, laser cutting tool, water cutting tool, or another appropriate means, to create a plurality of individual SLPs 80. The singulation process removes dambars 40 to electrically isolate contacts 28 of each device from each other. Support structures 46 and ridge 42 are also removed during singulation. While only a single SLP 80 is shown separated from panel 74 in FIG. 1g, every saw street 76 is normally cut along the entire length and width of the panel to separate every semiconductor die 64 into its own SLP.

Figure 1H:
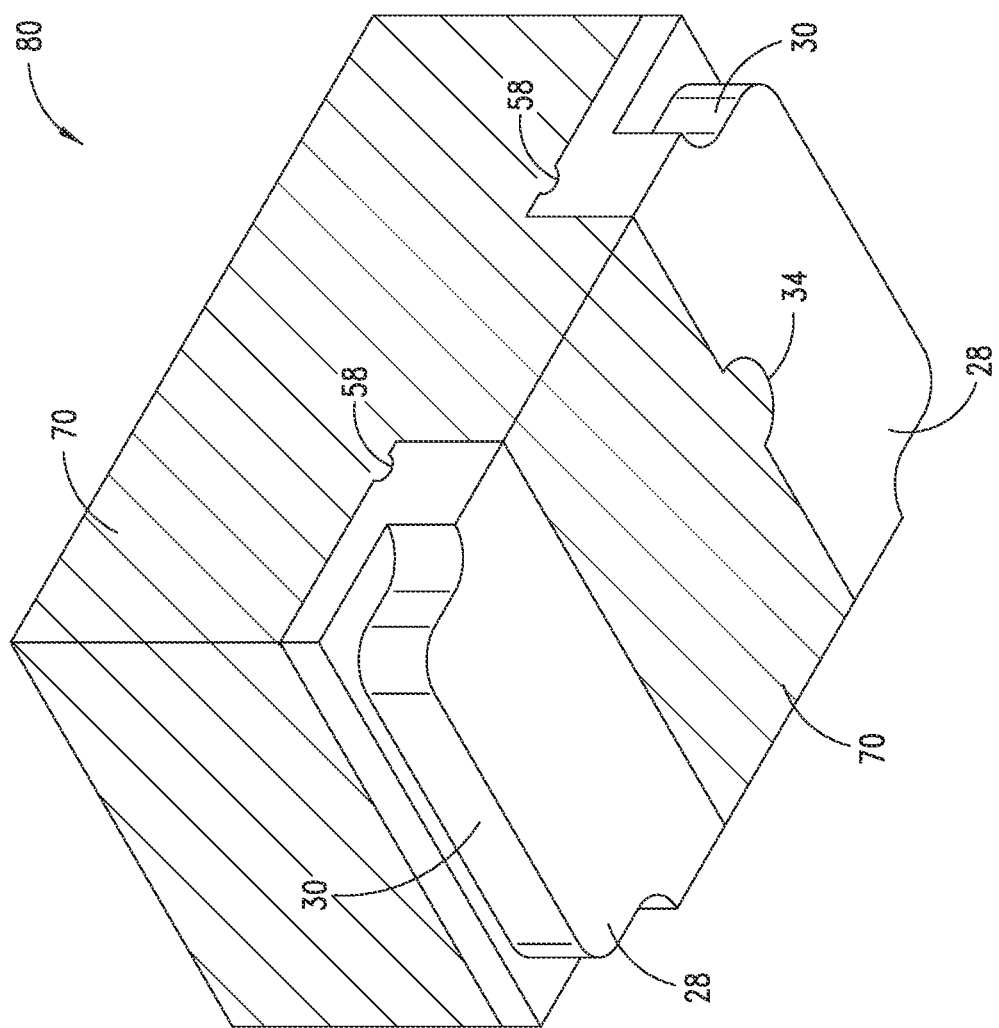

FIG. 1h illustrates an SLP 80 post-singulation. Each contact 28 includes a plated side surface 30 that allows solder to reflow up the side surface. Side surfaces 30 curve in the shape of a "U", resulting in a spread-out fillet that extends in three directions from contacts 28 and is easier for automated equipment to see. Side surfaces 30 are plated without the requirement to saw through leadframe 60 prior to plating. Side surfaces 30 are exposed using an etching process, which is more accurate and less prone to problems than the sawing process used in the prior art, such as copper burrs, copper smearing, and delamination.

Plating can be performed before or after encapsulant 70 is deposited. Plating is performed by the leadframe manufacturer in some embodiments, which can reduce packaging time. SLP 80 is a substantially symmetrical semiconductor package, with notch 34 remaining exposed from the encapsulant to indicate polarity of the device, e.g., which terminal is pin one. Singulation of panel 74 occurred through indentations 58, so the indentations are visible at the sides of the package.

Figure 2A:
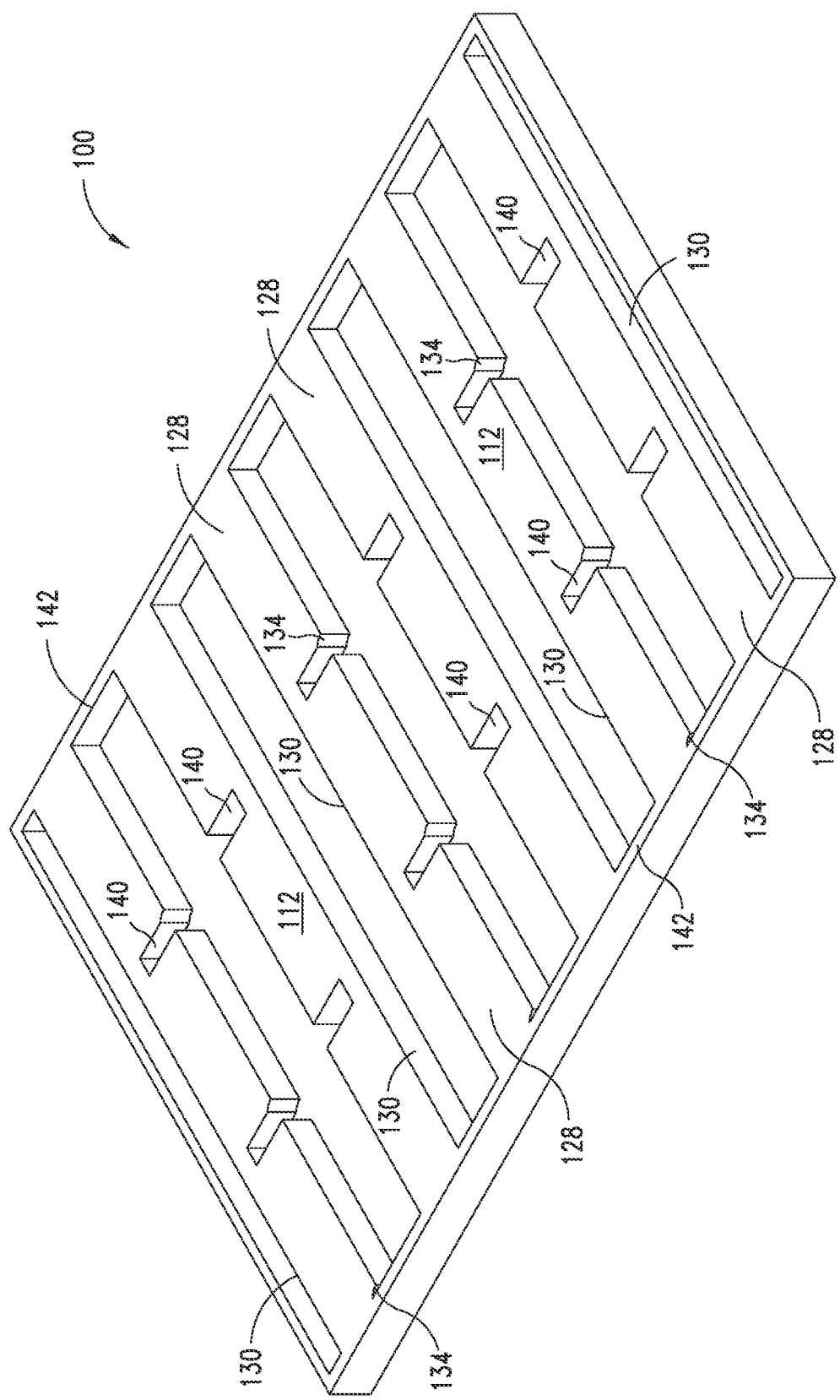
FIGS. 2a and 2b illustrate a leadframe and SLP with linear leads.
Figure 2B:
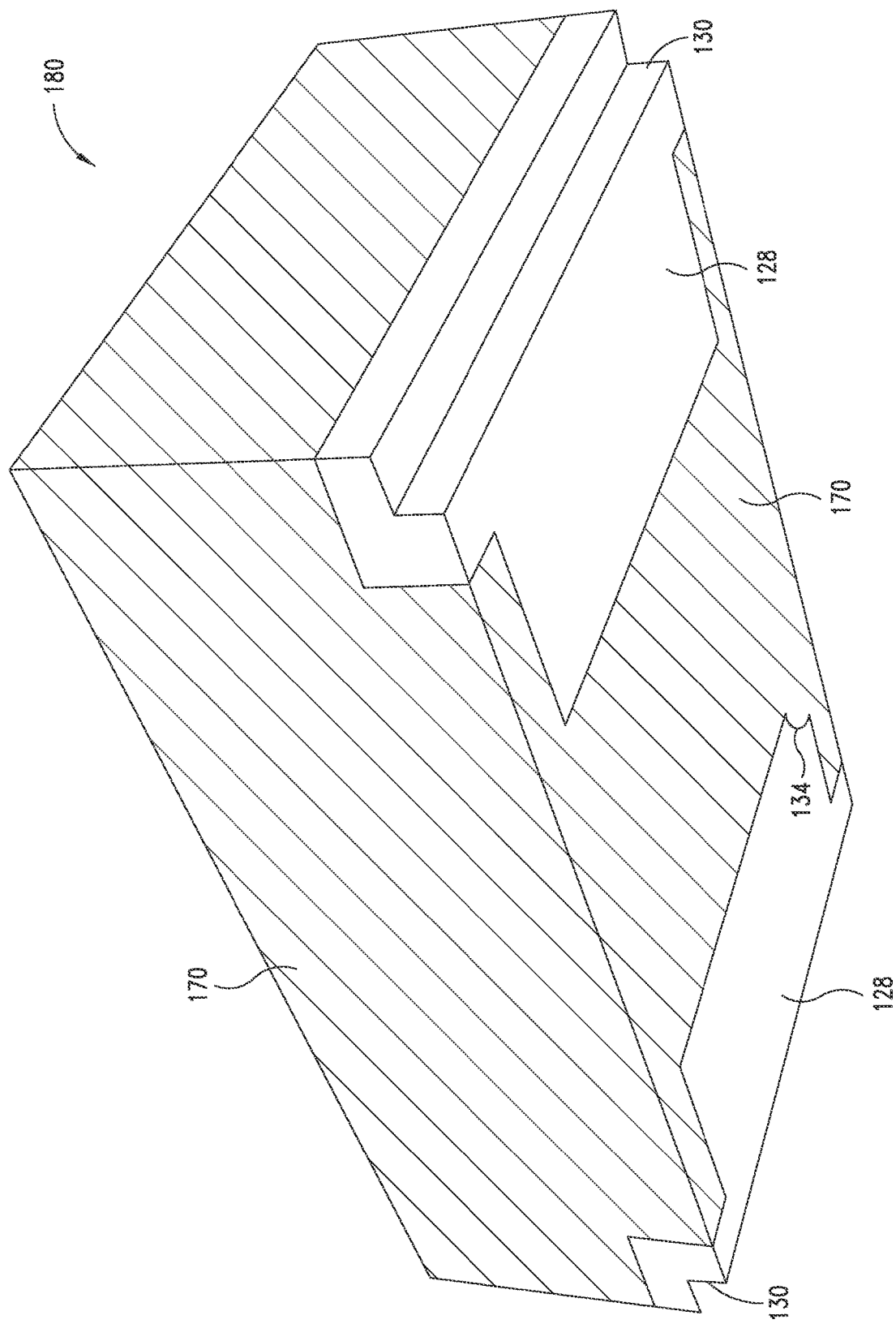

FIGS. 2a and 2b illustrate a second embodiment of forming an SLP. FIG. 2a illustrates a sheet 100 that begins as a sheet of conductive material substantially similar to sheet 10. Sheet 100 has top surface 112 half-etched to be in a similar state as sheet 10 in FIG. 1b. Sheet 100 includes two contacts 128 per device. Contacts 128 include side solderable surfaces 130 that are linear, rather than being U-shaped as in the first embodiment. One contact 128 per device includes a notch 134. Notches 134 are formed at the corners of contacts 128, unlike notches 34 in FIG. 1b which are at the centers of the contacts. Both notches 34 and notches 134 can be formed either at the corner, middle, or any other location of their respective contacts. Spaces 140 are optionally formed on the sides of contacts 128. Spaces 140 allow encapsulant to flow around three side surfaces of contacts 128 to improve mold lock. In some embodiments, dambars 40 are used between each unit to help contain encapsulant. Dambars 40 can split or replace spaces 140.

Sheet 100 is flipped and half-etched on the opposite side, similar to FIG. 1c, and then plated to finish the leadframe. Semiconductor die 64 is later disposed on contacts 128 and encapsulated as a panel. FIG. 2b illustrates a completed SLP 180 with linear side solderable surfaces 130. Side solderable surfaces 130 are plated without having to be sawn through because encapsulant 170 does not encroach into the space between adjacent side surfaces 130. Side solderable surfaces 130 can be plated by the leadframe manufacturer because making a package with the leadframe is done without covering the side surfaces.

Figure 3A:
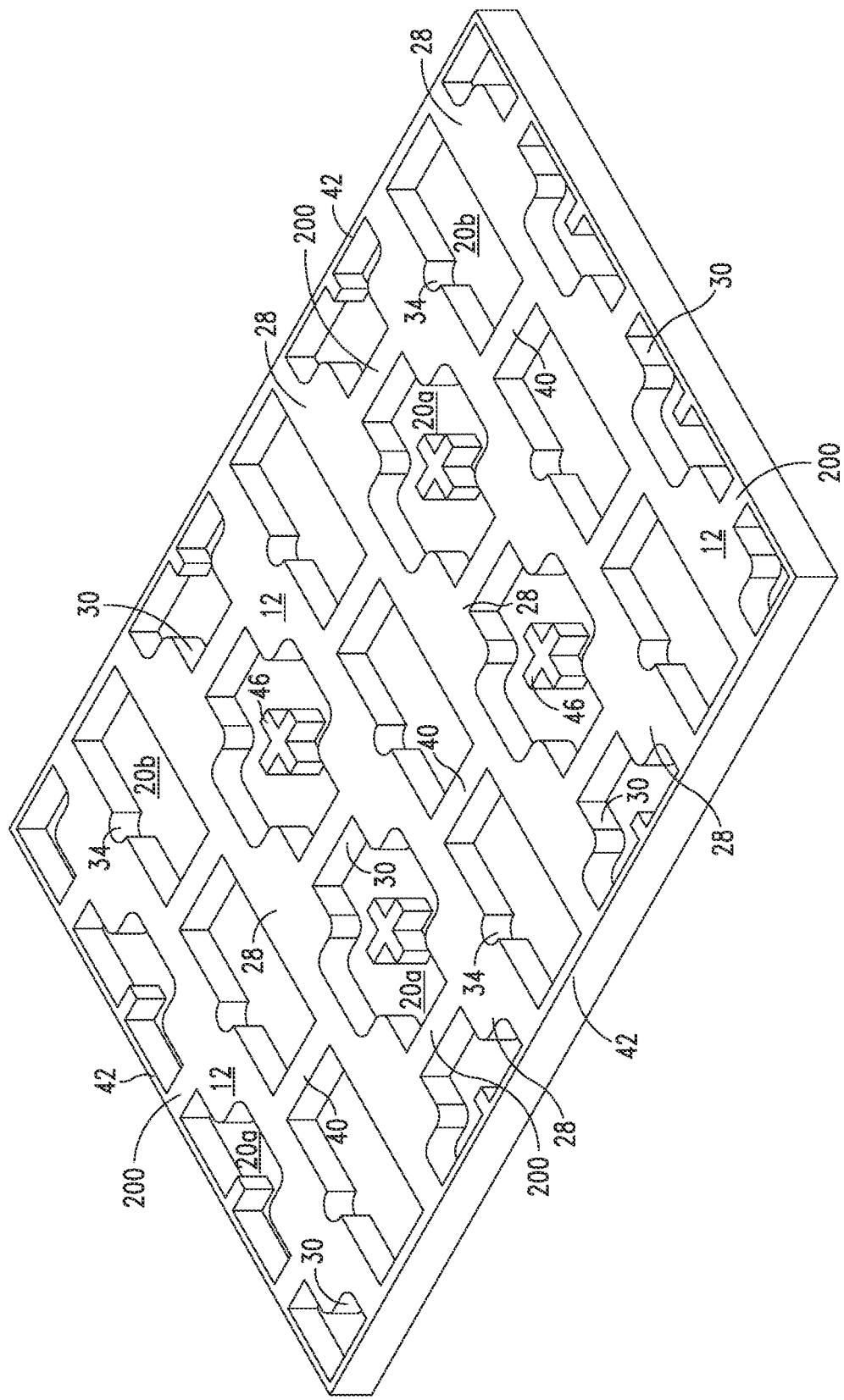
FIGS. 3a and 3b illustrate a leadframe and SLP with an additional support structure.
Figure 3B:
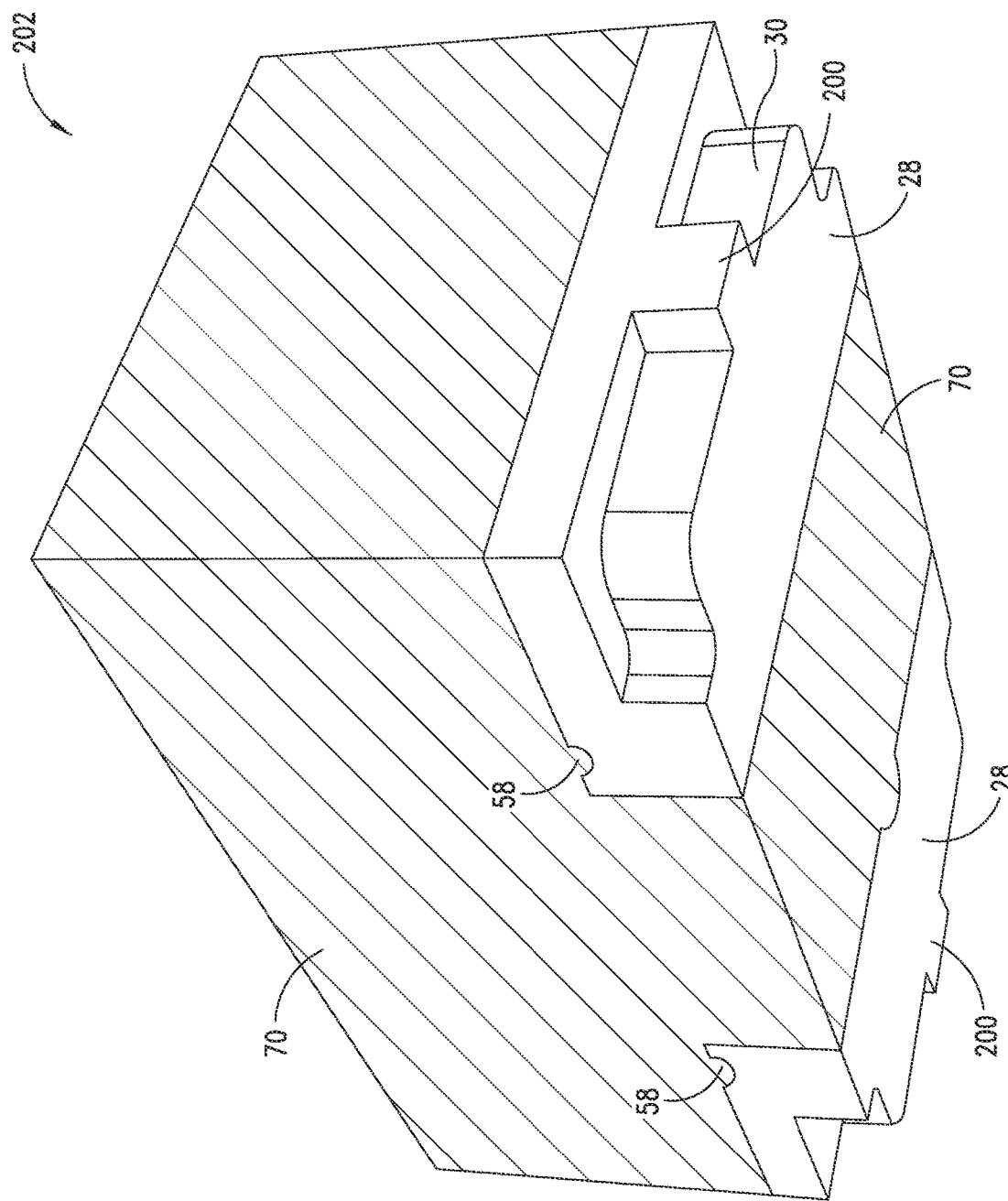

FIGS. 3a and 3b illustrate a third embodiment, which is substantially the same as the first embodiment in FIGS. 1a-1h, with the addition of support structures 200. In FIG. 3a, support structures 200 extend between adjacent side surfaces 30. Support structures 200 support the region of surface 20a between side surfaces 30 from being crushed during the encapsulation process in cases where support structures 46 alone are not sufficient.

FIG. 3b illustrates a completed SLP 202 with portions of support structures 200 remaining in the final device. Support structures 200 extend from side surfaces 30, so a portion of the support structures remain in the final SLP 202. The side surface of support structure 200 is not plated during the same plating step as side surface 30, because support structure 200 extends completely between adjacent side surfaces. Singulation of SLP 202 from a panel exposes surfaces of support structures 200 that were not exposed during plating. The "U" shape of side surface 30 provides a broad fillet overall, but the non-plated portion of support structure 200 may split the fillet into two sections. The solder fillet remains highly visible due to still extending out in three directions. An automatic visual inspection machine is easily programmed to look for a split fillet if necessary.

Figure 4A:
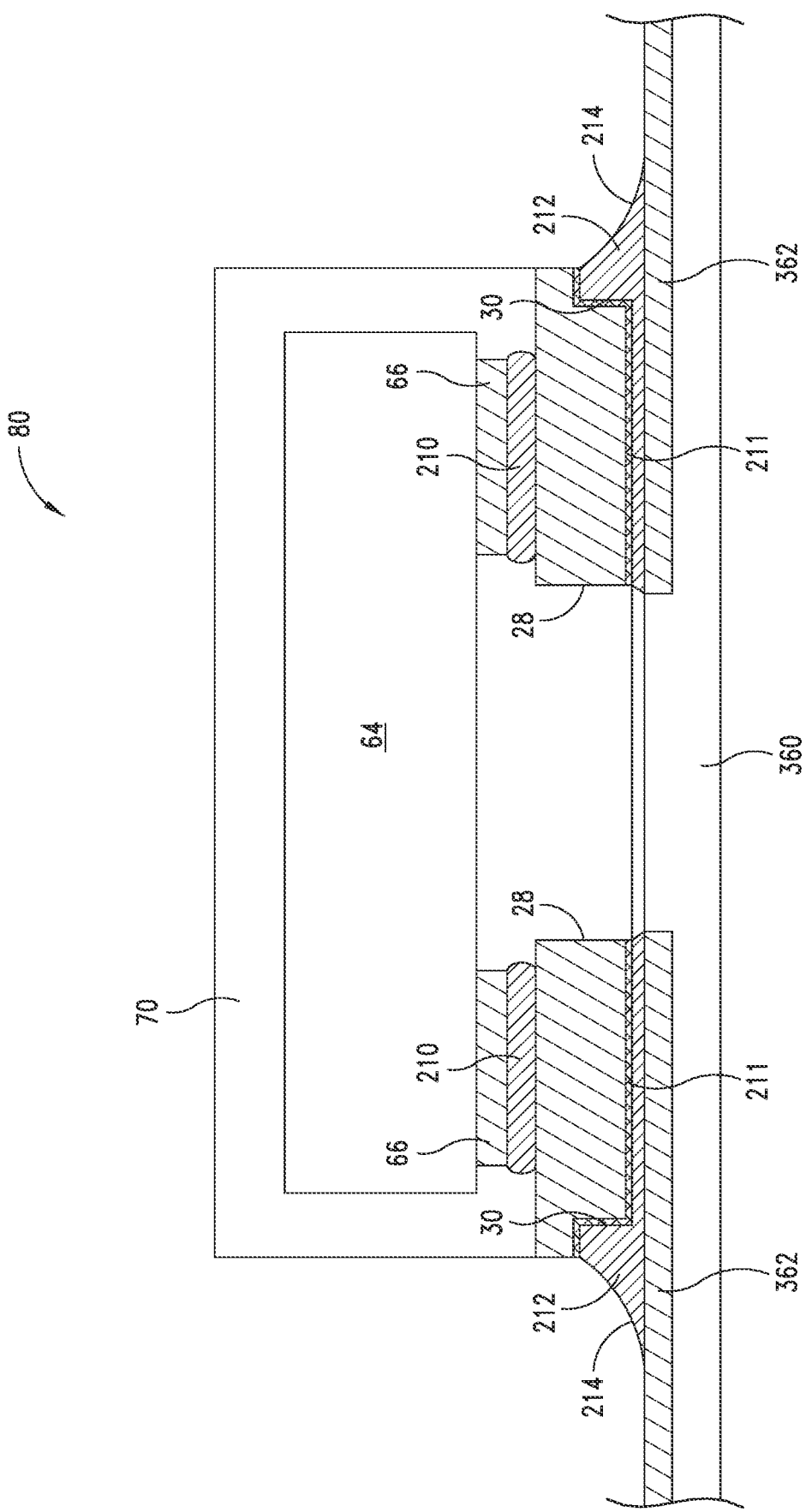
FIGS. 4a and 4b illustrate the side solderable packages installed on a PCB.
Figure 4B:
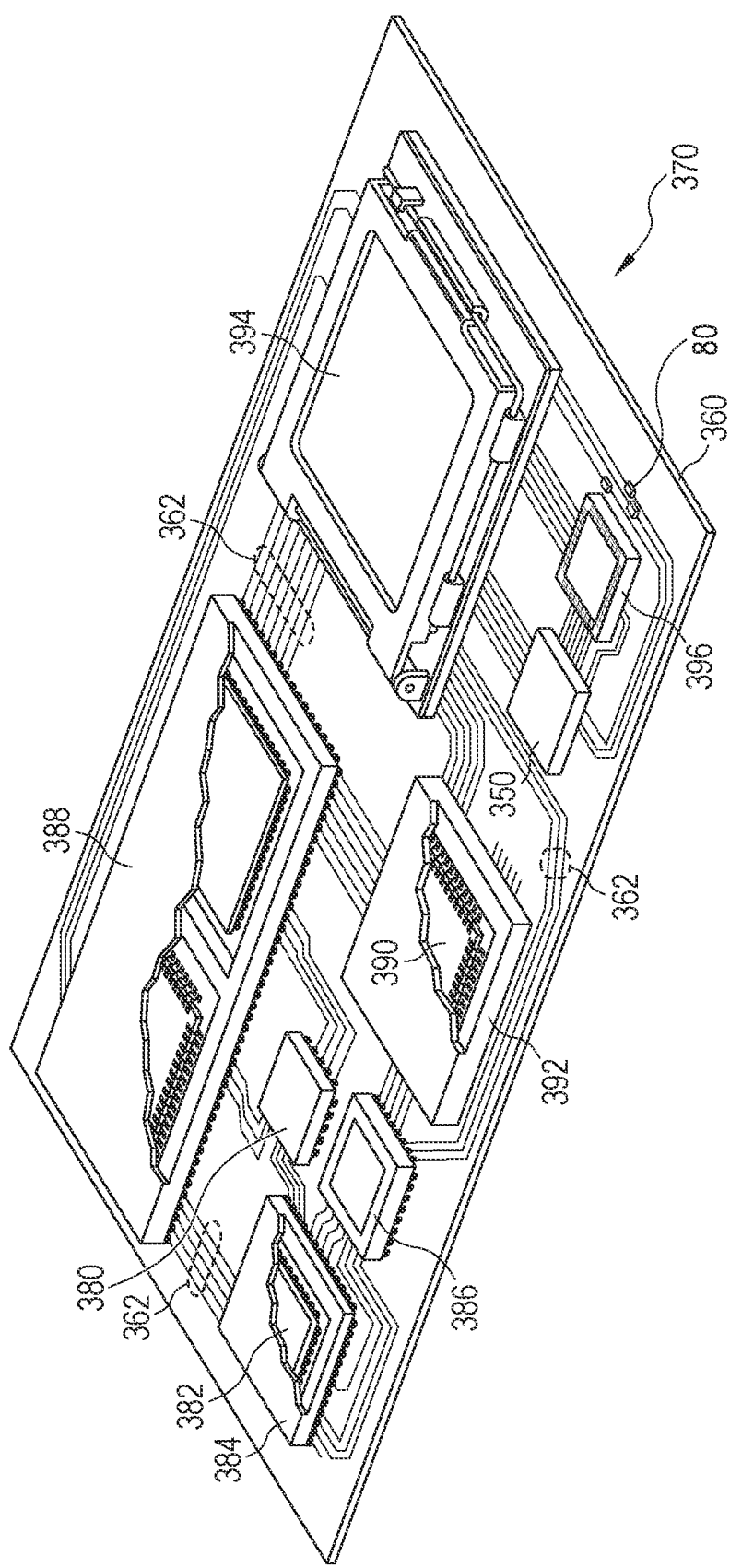

FIGS. 4a and 4b illustrate the SLPs installed on a printed circuit board (PCB). FIG. 4a shows a cross sectional view of package 80. Semiconductor die 64 has two contact pads 66 connected to contacts 28 by solder 210. Any suitable type or form-factor of semiconductor die or electrical component can be used in other embodiments. Encapsulant 70 covers semiconductor die 64 and contacts 28, but leaves bottom and side surfaces of the contacts exposed.

In the cross-section of FIG. 4a, the wettable conductive layer 211 plated over contacts 28, including side surfaces 30, is visible. The plating may extend over different surfaces depending on the stage of manufacturing when plating occurs. If plating occurs prior to encapsulation, conductive layer 211 may extend up the inside surfaces of contacts 28. Solder 212 mechanically bonds and electrically connects SLP 80 to a PCB or other substrate 360. When reflowed, solder 212 wets up side surface 30 to form a fillet 214 between contact 28 and conductive layer 362 of PCB 360. Fillet 214 extends outside a footprint of SLP 80 to be visible using an external inspection system.

FIG. 4b illustrates three SLPs 80 mounted on PCB 360 as part of an electronic device 370. A plurality of semiconductor packages are mounted on a surface of the PCB along with SLPs 80. Electronic device 370 can have one type of semiconductor package, or multiple types of semiconductor packages, depending on the application.

Electronic device 370 can be a stand-alone system that uses the semiconductor packages to perform one or more electrical functions. Alternatively, electronic device 370 can be a subcomponent of a larger system. For example, electronic device 370 can be part of a tablet, cellular phone, digital camera, communication system, or other electronic device. Electronic device 370 can also be a graphics card, network interface card, or other signal-processing card that can be inserted into a computer. The semiconductor packages can include microprocessors, memories, ASIC, logic circuits, analog circuits, RF circuits, discrete devices, or other semiconductor die or electrical components.

In FIG. 4b, PCB 360 provides a general substrate for structural support and electrical interconnect of the semiconductor packages mounted on the PCB. Conductive signal traces 362 are formed over a surface or within layers of PCB 360 using evaporation, electrolytic plating, electroless plating, screen printing, or other suitable metal deposition process. Signal traces 362 provide for electrical communication between each of the semiconductor packages, mounted components, and other external system components. Traces 362 also provide power and ground connections to the semiconductor packages as needed.

While one or more embodiments have been illustrated and described in detail, the skilled artisan will appreciate that modifications and adaptations to those embodiments may be made without departing from the scope of the present disclosure.

What is claimed:

1. A semiconductor device, comprising:
   a semiconductor die;
   an encapsulant deposited over the semiconductor die; and
   a plurality of contacts exposed from the encapsulant, wherein each of the plurality of contacts includes a half-etched portion forming a side surface that extends for an entire length or width of the encapsulant, wherein the side surface includes a convex U-shaped curve, and wherein the side surface includes a solder wettable layer formed over the side surface including on the convex U-shaped curve.

2. The semiconductor device of claim 1, wherein the side surface of each of the plurality of contacts is exposed from the encapsulant.

3. The semiconductor device of claim 1, further including an indentation formed in each of the plurality of contacts with the encapsulant deposited within the indentation of each of the plurality of contacts.

4. The semiconductor device of claim 1, wherein one of the plurality of contacts includes a notch.

5. The semiconductor device of claim 1, wherein the side surface is U-shaped in plan view.

6. The semiconductor device of claim 1, further including:
   a substrate; and
   a solder fillet extending from a first contact of the plurality of contacts to the substrate.

7. The semiconductor device of claim 6, wherein the solder fillet extends from the first contact to outside a footprint of the encapsulant in three different directions.

8. A semiconductor device, comprising:
   a semiconductor die;
   an encapsulant deposited over the semiconductor die; and
   a contact including an exposed side surface that extends for an entire length or width of the encapsulant, wherein the side surface includes a convex curve, wherein the side surface is formed by half-etching such that a height of the side surface is less than a height of the contact and a portion of the contact above the side surface extends beyond the side surface to an edge of the encapsulant.

9. The semiconductor device of claim 8, wherein the side surface is exposed from the encapsulant.

10. The semiconductor device of claim 8, further including an indentation formed in the contact with the encapsulant deposited within the indentation.

11. The semiconductor device of claim 8, wherein the contact includes a notch filled with encapsulant and visible from outside the encapsulant.

12. The semiconductor device of claim 8, wherein the side surface is plated with a solder wettable layer.

13. The semiconductor device of claim 8, further including:
   a substrate; and
   a solder fillet extending from the contact to the substrate.

14. The semiconductor device of claim 13, wherein the solder fillet extends from the contact in three different directions.

15. A semiconductor device, comprising:
   a semiconductor die;
   an encapsulant deposited over the semiconductor die; and
   a contact including a half-etched portion that extends for an entire length or width of the encapsulant, wherein the contact includes a convex curve, wherein a side surface of the contact is exposed from the encapsulant, and wherein the side surface of the contact extends for the entire length or width of the encapsulant.

16. The semiconductor device of claim 15, wherein the convex curve is U-shaped in plan view.

17. The semiconductor device of claim 15, further including:
- a substrate; and
- a solder fillet extending from the contact to the substrate, wherein the solder fillet extends from the contact in three different directions.

* * * * *